US008729586B2

(12) United States Patent
Wu et al.

(10) Patent No.: US 8,729,586 B2
(45) Date of Patent: May 20, 2014

(54) LIGHT-EMITTING DIODE DEVICE

(75) Inventors: Chia-Hao Wu, Taipei (TW); Chen-Hsiu Lin, Taipei (TW); Ming-Kun Weng, Taipei (TW); Yi-Chien Chang, Taipei (TW)

(73) Assignees: Lite-On Electronics (Guangzhou) Limited, Guangzhou (CN); Lite-On Technology Corp., Taipei (TW)

( * ) Notice: Subject to any disclaimer, the term of this patent is extended or adjusted under 35 U.S.C. 154(b) by 0 days.

(21) Appl. No.: 13/558,557

(22) Filed: Jul. 26, 2012

(65) Prior Publication Data
US 2013/0105835 A1  May 2, 2013

(30) Foreign Application Priority Data

Oct. 31, 2011  (CN) .......................... 2011 1 0349346

(51) Int. Cl.
*H01L 33/00* (2010.01)

(52) U.S. Cl.
USPC .................. 257/98; 257/88; 257/89; 257/100

(58) Field of Classification Search
USPC ........................ 257/88, 89, 98, 100
See application file for complete search history.

(56) References Cited

U.S. PATENT DOCUMENTS

| 7,670,031 | B2 * | 3/2010 | Ogawa et al. | 362/311.02 |
| 8,018,139 | B2 * | 9/2011 | Chou | 313/503 |
| 2010/0157583 | A1 * | 6/2010 | Nakajima | 362/184 |
| 2011/0058369 | A1 * | 3/2011 | Imamura et al. | 362/231 |
| 2011/0278605 | A1 * | 11/2011 | Agatani et al. | 257/89 |

FOREIGN PATENT DOCUMENTS

JP          10-260638       * 9/1998

* cited by examiner

*Primary Examiner* — Tan N Tran
(74) *Attorney, Agent, or Firm* — Rosenberg, Klein & Lee

(57) ABSTRACT

A light-emitting diode device includes: a substrate; an upper metal film disposed on an upper surface of the substrate, and including a chip-mounting region and a plurality of conductive pad regions; two first light-emitting chips and two second light-emitting chips disposed on the chip-mounting region, the first and second light-emitting chips being disposed alternately, two of the first and second light-emitting chips being opposite to each other; a fluorescent layer coated on the first light-emitting chips; and a lens disposed on the substrate to cover the first and second light-emitting chips and the fluorescent layer.

29 Claims, 10 Drawing Sheets

US 8,729,586 B2

LIGHT-EMITTING DIODE DEVICE

CROSS-REFERENCE TO RELATED APPLICATION

This application claims priority of China application no. 201110349346.9, filed on Oct. 31, 2011.

BACKGROUND OF THE INVENTION

1. Field of the Invention

This invention relates to a light-emitting diode device, and more particularly to a light-emitting diode device having two different kinds of light-emitting chips.

2. Description of the Related Art

In a conventional light-emitting diode device, white light is generally generated by exciting red fluorescent powders and green fluorescent powders using a blue light-emitting chip. However, the conventional light-emitting diode device has inferior light-emitting efficiency. Therefore, the issue of how to efficiently package a light-emitting diode device to achieve superior light-emitting efficiency still requires improvement.

SUMMARY OF THE INVENTION

Therefore, an object of the present invention is to provide a high power light-emitting diode device that is efficiently packaged with two different light-emitting chips and that has improved light-emitting efficiency.

Another object of the present invention is to provide a high power light-emitting diode device that has improved light-emitting uniformity.

The light-emitting diode device of this invention provides a large area of a chip-mounting region for disposing first and second light-emitting chips so that light from lateral sides of the first and second light-emitting chips will not be blocked. Light reflection from the chip-mounting region of an upper metal film and coating of the fluorescent layer on the first light-emitting chips would improve light-emitting efficiency. Meanwhile, heat dissipating efficiency can be improved by virtue of the chip-mounting region of the upper metal film and the heat-dissipation region of a lower metal film. Moreover, the uniformity of a mixed light can be enhanced by virtue of a diffuser. A side face of each of the second light-emitting chips inclining at an angle of 40° to 50° with respect to an adjacent side face of one of the first light-emitting chips would not only increase light-emitting efficiency but also result in a substantially equal viewing angle at 0-degree axis and 90-degree axis.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Figure 1:
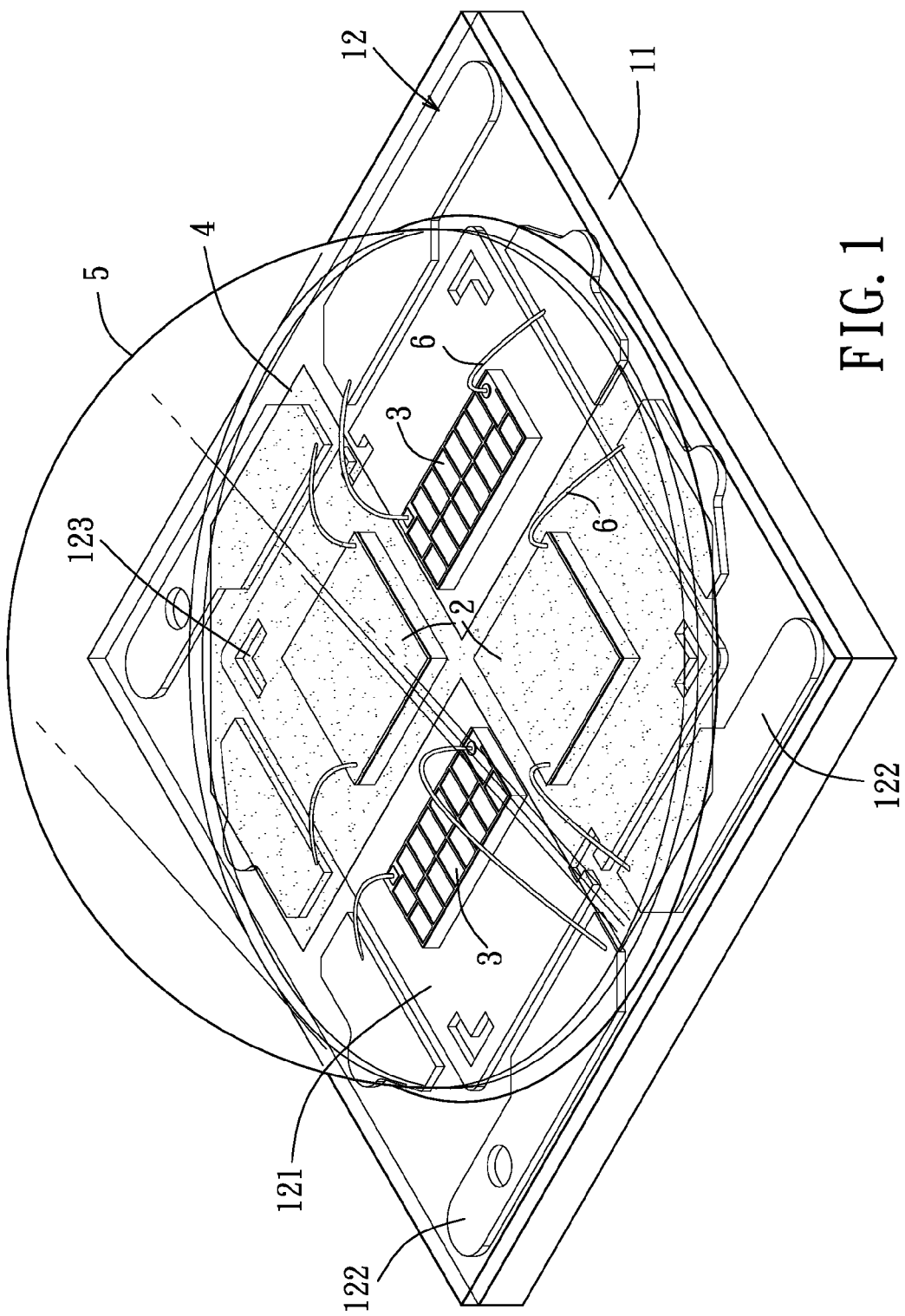
FIG. 1 is a perspective view of the first preferred embodiment of a light-emitting diode device according to the present invention.

Before the present invention is described in greater detail with reference to the accompanying preferred embodiments, it should be noted herein that like elements are denoted by the same reference numerals throughout the disclosure.

Referring to FIGS. 1 to 5, the first preferred embodiment of a light-emitting diode device of the present invention comprises: a substrate 11, an upper metal film 12, a lower metal film 13, two first light-emitting chips 2, two second light-emitting chips 3, a fluorescent layer 4 and a lens 5. In this embodiment, the first light-emitting chips 2 may be blue light-emitting chips and the second light-emitting chips 3 may be red light-emitting chips. When the fluorescent layer 4 containing yellow fluorescent powders is coated on the blue light-emitting chips, the yellow fluorescent powders can be excited by blue light produced by the blue light-emitting chips to produce white light. Alternatively, the first light-emitting chips 2 may be ultraviolet light-emitting chips and the second light-emitting chips 3 may be red light-emitting chips. When the fluorescent layer 4 containing red, green, and blue fluorescent powders is coated on the ultraviolet light-emitting chips, the red, green, and blue fluorescent powders can be excited by ultraviolet light produced by the ultraviolet light-emitting chips to produce white light. In addition, since the red light-emitting chips are not covered by the fluorescent layer, the luminous efficiency of the light-emitting diode device can be enhanced by virtue of the light emitted from the red light-emitting chips, and a high color rendering index can be accomplished by virtue of the red light-emitting chips. The types of the first light-emitting chips and the second light-emitting chips are not limited to the abovementioned ones. For first light-emitting chips, any light-emitting chips that can be coated with the fluorescent layer to obtain a mixed light would fall in the scope of the present invention.

The substrate 11 is made of a ceramic material that is electrically insulated and is thermally conductive. The upper metal film 12 is disposed on an upper surface of the substrate 11, and includes a chip-mounting region 121 and a plurality of conductive pad regions 122 surrounding the chip-mounting region 121. The upper metal film 12 is further formed with a plurality of recesses 123 in the chip-mounting region 121 and proximate to a periphery of the chip-mounting region 121. Each of the recesses has a T shape or L shape in cross section. The lower metal film 13 is disposed on a lower surface of the substrate 11, and has a plurality of heat-dissipation regions 131 and a plurality of solder pad regions 132 that respectively correspond in position to the conductive pad regions 122. In addition, the light-emitting diode device of this embodiment further includes a plurality of metal interconductors (not shown) that are disposed between the upper and lower metal films 12, 13. Specifically, each of the metal interconductors passes through the substrate 11 to interconnect one of the conductive pad regions 122 and a respective one of the solder pad regions 132. That is, each of the metal interconductors is located in a region of the substrate 11 corresponding in position to the location of the one of the conductive pad regions 122 and the respective one of the solder pad regions 132.

Figure 11:
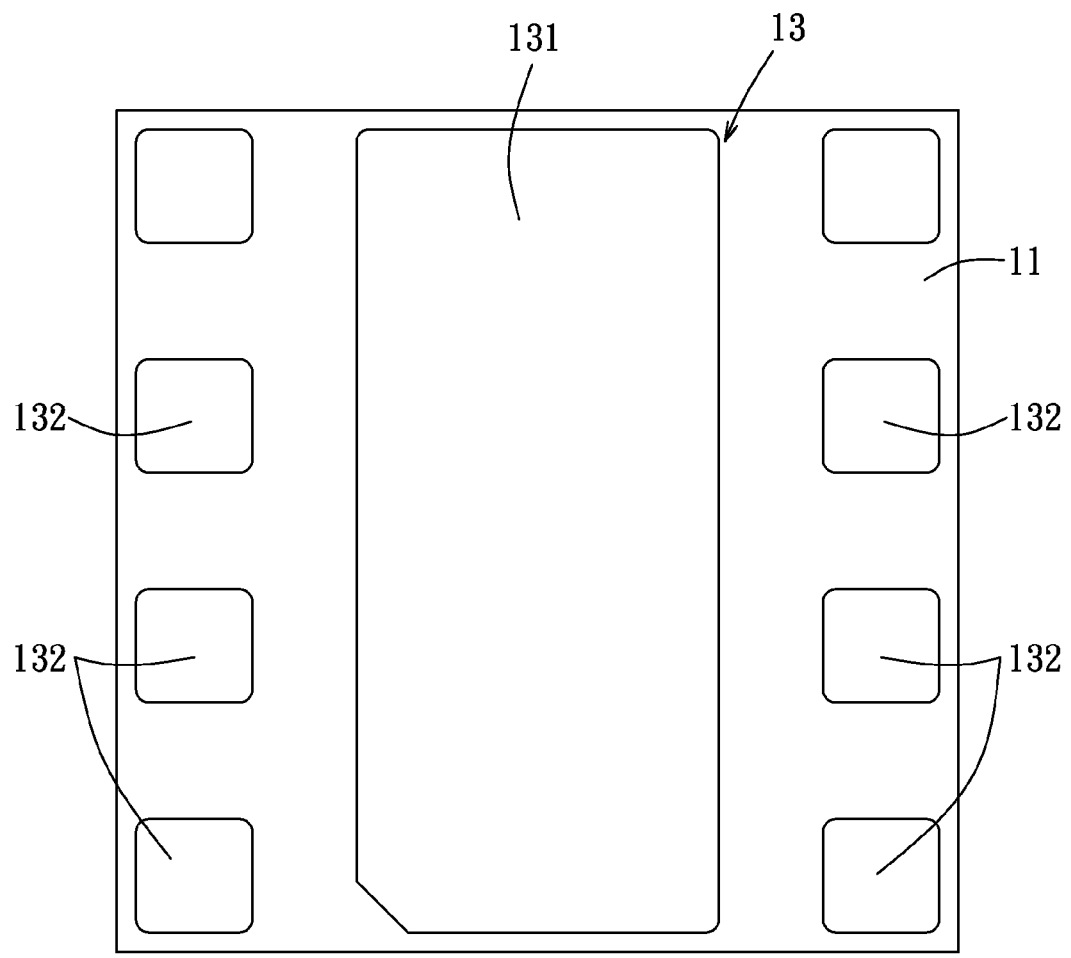
FIG. 11 is a bottom view of the second preferred embodiment shown in FIG. 10.

The chip-mounting region 121 is used to mount the first light-emitting chips 2 and the second light-emitting chips 3. The conductive pad regions 122 are used to bond wires 6 that connect to chip electrodes (not shown) of the first and second light-emitting chips 2, 3. That is, the chip electrodes are electrically connected to the conductive pad regions 122 by virtue of the wires 6. In this embodiment, the light-emitting diode device comprises eight of the conductive pad regions 122. The chip-mounting region 121 has four sides each of which is adjacent to respective two of the conductive pad regions 122, so that each of the first light-emitting chips 2 and the second light-emitting chips 3 can correspond respectively to respective two of the conductive pad regions 122. Therefore, ON/OFF of each of the first light-emitting chips 2 and the second light-emitting chips 3 can be controlled individually. In addition, the chip-mounting region 121 is a square region and the area thereof is maximized while each of the conductive pad regions 122 is a narrow, elongated region so as to minimize the area thereof. In this manner, the chip-mounting region 121 of the upper metal film can have a relatively large area so as to reflect light in the large area and increase the heat-dissipation rate. With the maximization of the area of the chip-mounting region 121, different sizes of light-emitting chips can be selected for packaging purposes, thereby enhancing the selectivity of the light-emitting chips of the light-emitting diode device. In this embodiment, only one chip-mounting region 121 is used for mounting the first light-emitting chips 2 and the second light-emitting chips 3. However, the present invention is not limited thereto, and a plurality of chip-mounting regions 121 may be designed for the first light-emitting chips 2 and the second light-emitting chips 3. In this embodiment, four of the heat-dissipation regions 131 are disposed in a middle area of the lower metal film 13 and are arranged in two rows, each having two of the heat-dissipation regions 131, so as to be in uniform contact with a solder material when a soldering process is performed, thereby increasing the solder bonding strength. Of course, the heat-dissipation regions 131 may be connected to form a single piece, as best illustrated in FIG. 11. In this embodiment, each of the heat-dissipation regions 131 is adjacent to respective two of the solder pad regions 132. Although the solder pad regions 132 and the conductive pad regions 122 are different in shape, each of the conductive pad regions 122 corresponds in position to one of the solder pad regions 132 so that the conductive pad regions 122 and the solder pad regions 132 can be interconnected by the metal interconductors as described above.

Specifically, the substrate 11 is manufactured by first preparing a sintered ceramic sheet, followed by forming through holes (not shown) in the ceramic sheet at positions where the metal interconductors are to be disposed. The upper and lower surfaces of the substrate 11 are then covered respectively by the upper metal film 12 and the lower metal film 13, and metal layers are deposited in the through holes to form the metal interconductors. Since the substrate 11 has been sintered and the shape thereof is thus fixed before the upper metal film 12, the lower metal film 13 and the metal interconductors are formed, there is no risk of shrinkage and deformation of the substrate 11, thereby enhancing the product reliability. In this embodiment, the upper metal film 12 and the lower metal film 13 are copper metal layers and are formed by sputtering a seed layer and then depositing by means of an electroplating process. The copper is also deposited on walls of the through holes to interconnect the upper metal film 12 and the lower metal film 13 to form the metal interconductors during the electroplating process.

After the upper metal film 12 and the lower metal film 13 are formed, the upper metal film 12 and the lower metal film 13 are patterned by means of a photolithography process to form the chip-mounting region 121, the conductive pad regions 122 and the recesses 123 in the upper metal film 12 while the heat-dissipation regions 131 and the solder pad regions 132 are formed in the lower metal film 13. The through holes of the substrate 11 are formed in the regions of the substrate 11 corresponding in position to the locations of the conductive pad regions 122 and the solder pad regions 132, so that the metal interconductors can establish an electrical connection between the conductive pad regions 122 and the solder pad regions 132.

Figure 6:
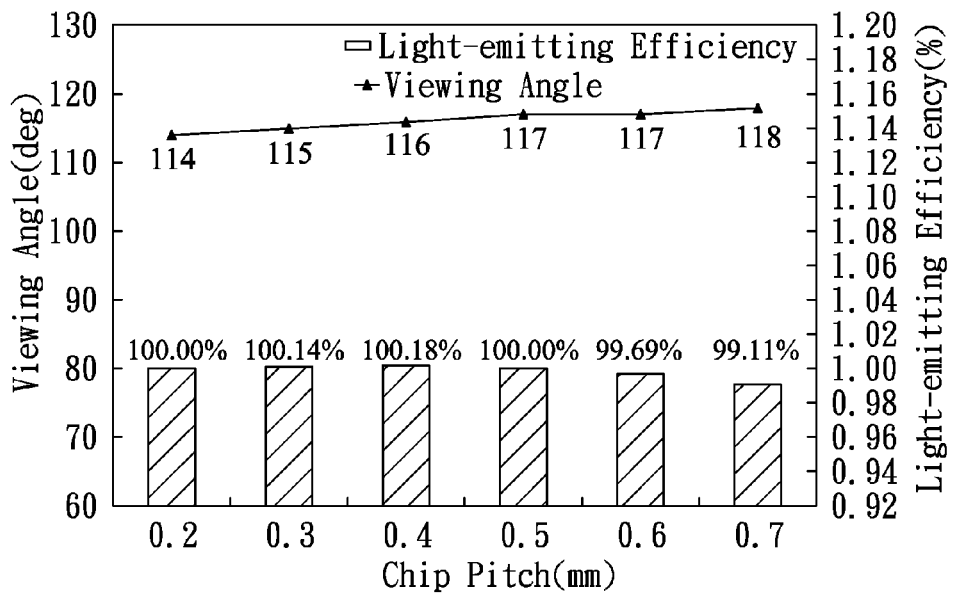
FIG. 6 is a chart for explaining the relationship among a chip pitch, light-emitting efficiency and a viewing angle of the first preferred embodiment.

Two first light-emitting chips 2 and two second light-emitting chips 3 are disposed on the chip-mounting region 121. The first and second light-emitting chips 2, 3 are disposed alternately, especially, in an angular direction. Two of the first and second light-emitting chips 2, 3 are opposite to each other. Preferably, the two first light-emitting chips 2 are located on one diagonal line of the square chip-mounting region 121 while the two second light-emitting chips 3 are located on the other diagonal line of the square chip-mounting region 121, so that the first light-emitting chips 2 and the second light-emitting chips 3 are staggered with one another, as best illustrated in FIG. 1. The first light-emitting chips 2 and the second light-emitting chips 3 are preferably spaced apart from one another by a distance (chip pitch, d) ranging from 0.2 mm to 0.5 mm, thus obtaining an improved light-emitting efficiency and light-mixing effect (see FIG. 6). After the first and second light-emitting chips 2, 3 are fixed, the positive and negative electrodes of each of the first light-emitting chips 2 and second light-emitting chips 3 are connected to the respective two of the conductive pad regions 122 adjacent to each of the first and second light-emitting chips 2, 3, thereby connecting electrically to the corresponding solder pad regions 132. It is noted that the total number of the conductive pad regions 122 is twice the total number of the first and second light-emitting chips 2, 3 so that each of the first and second light-emitting chips 2, 3 may be independently controlled.

Figure 4:
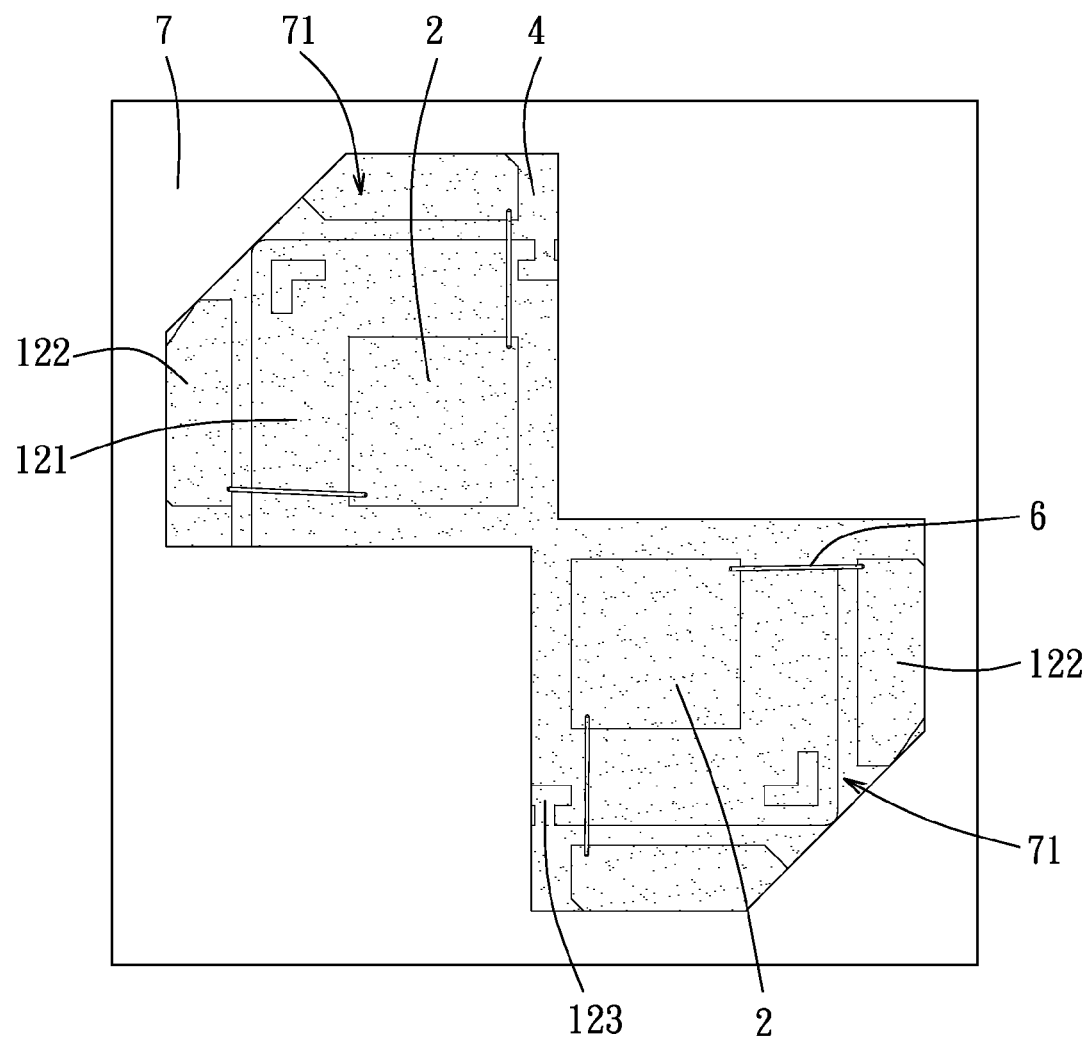
FIG. 4 is a top view of the first preferred embodiment illustrating coating a fluorescent layer on first light-emitting chips and on parts of a chip-mounting region proximate to the first light-emitting chips using a mask.

The fluorescent layer 4 is coated, e.g., spray-coated, on the first light-emitting chips 2 and on parts of the chip-mounting region 121 proximate to the first light-emitting chips 2, and is spaced apart from the second light-emitting chips 3 by a distance (i.e., the fluorescent layer 4 is not coated on the second light-emitting chips 3). Referring to FIG. 4, the coating of the fluorescent layer 4 is performed by using a mask 7 to control the fluorescent layer 4 to cover merely the first light-emitting chips 2 and the parts of the chip-mounting region 121 proximate to the first light-emitting chips 2 excluding the second light-emitting chips 3, so that the light emitted from the first light-emitting chips 2 may excite the fluorescent layer 4 while the second light-emitting chips 3 may not be blocked by the fluorescent layer 4 that may adversely affect the light-emitting efficiency of the second light-emitting chips 3. The brightness of the light-emitting diode device of this embodiment can be increased by 8% compared to a control group in which the second light-emitting chips 3 are covered by the fluorescent layer 4. Specifically, the mask 7 has two openings 71 that correspond in position to the first light-emitting chips 2 to expose the two first light-emitting chips 2 and the parts of the chip-mounting region 121 proximate to the first light-emitting chips 2. The mask 7 covers the two second light-emitting chips 3 and a part of the substrate 11. Each of the openings 71 has a diamond shape to reduce the coating area of the fluorescent layer 4, thereby saving the coating material. In addition, each of the second light-emitting chips 3 is covered with an area of the mask 7 that extends beyond a periphery of each second light-emitting chip 3 at least 0.1 mm to ensure that the fluorescent layer 4 may not cover the second light-emitting chips 3 during the spray coating process. In this embodiment, the first light-emitting chips 2 and the second light-emitting chips 3 are fixed on the planar chip-mounting region 121 and then the fluorescent layer 4 is coated on the first light-emitting chips 2 and the parts of the chip-mounting region 121 proximate to the first light-emitting chips 2. Therefore, the drawbacks of light blocked by side walls may be eliminated, and a large area of the chip-mounting region 121 can be used to reflect light, thereby enhancing the light-emitting efficiency. Meanwhile, the heat-dissipation speed can also be increased to meet the heat-dissipation requirements of a high power light-emitting chip. Although, in this embodiment, the fluorescent layer 4 also covers the parts of the chip-mounting region 121 proximate to the first light-emitting chips 2, the fluorescent layer 4 may be coated only on the first light-emitting chips 2 as will be described later in a second preferred embodiment.

Figure 2:
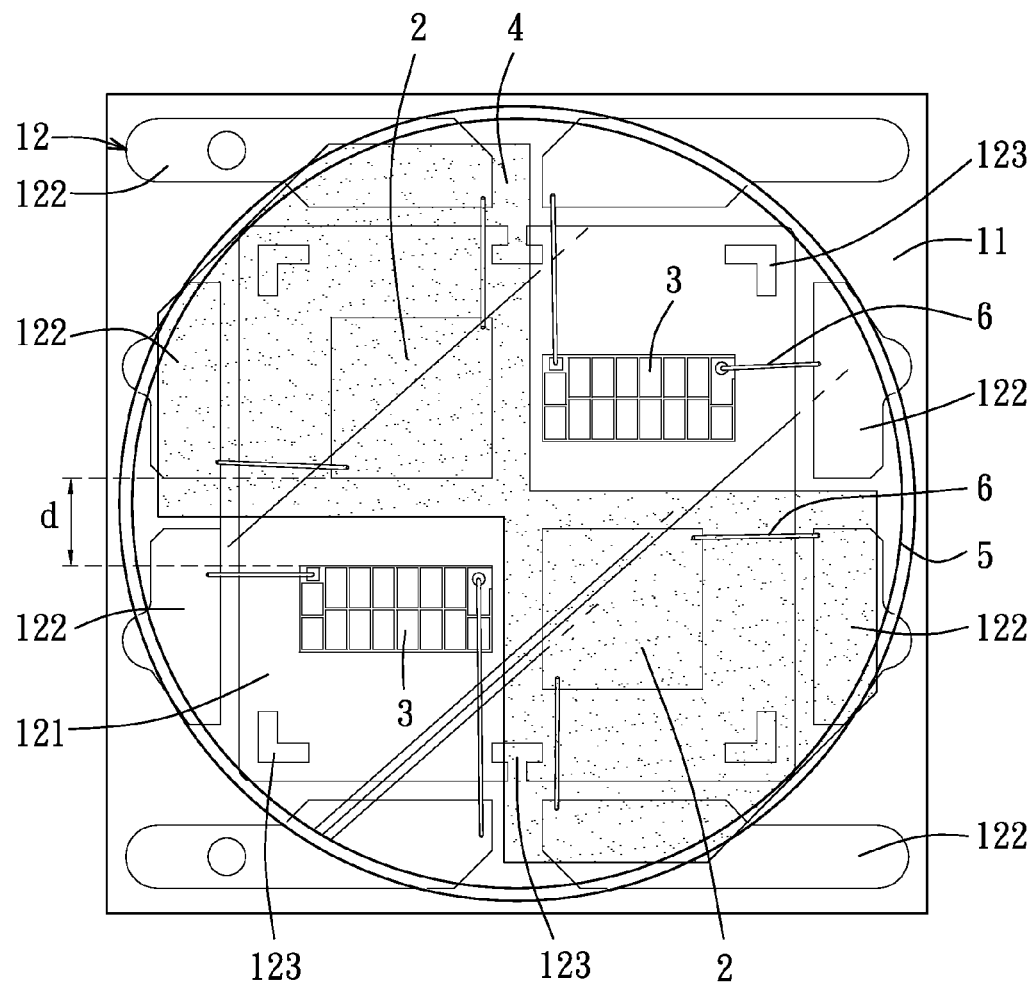
FIG. 2 is a top view of the first preferred embodiment shown in FIG. 1.
Figure 3:
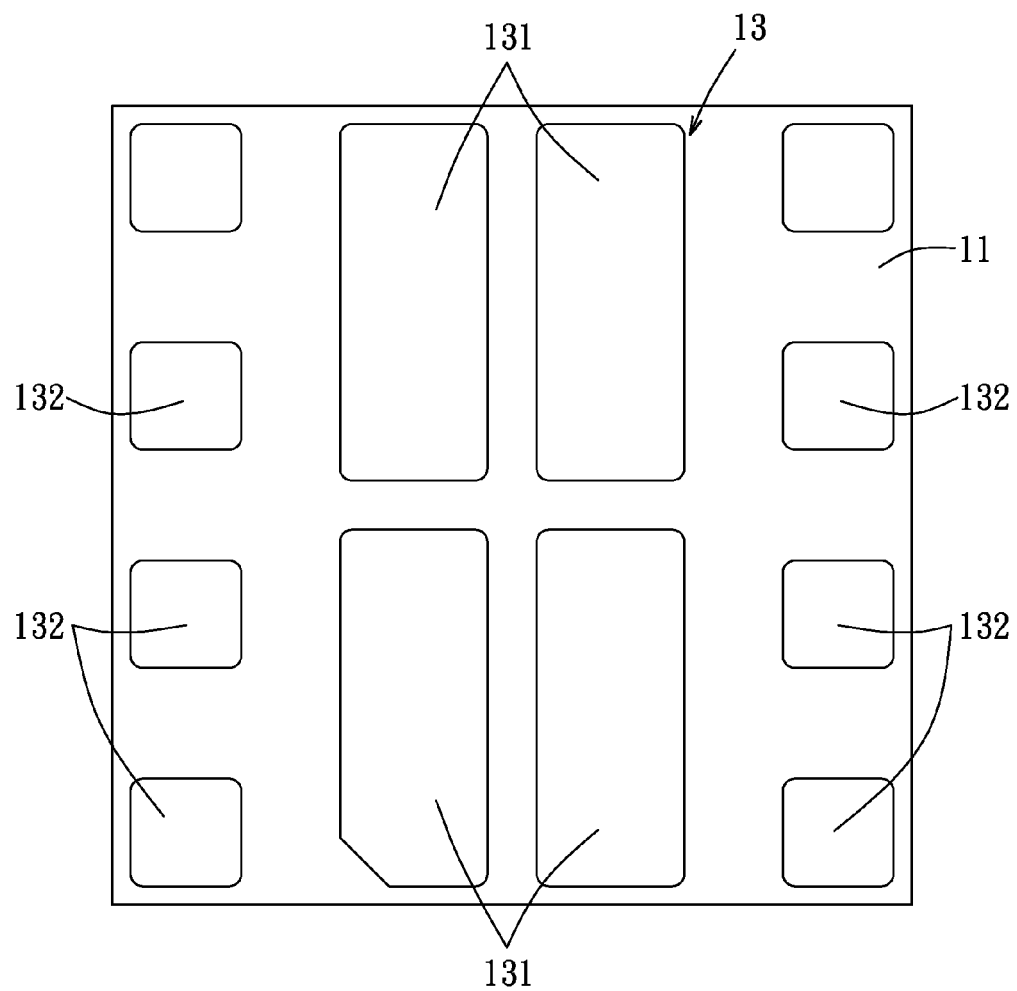
FIG. 3 is a bottom view of the first preferred embodiment shown in FIG. 1.
Figure 5:
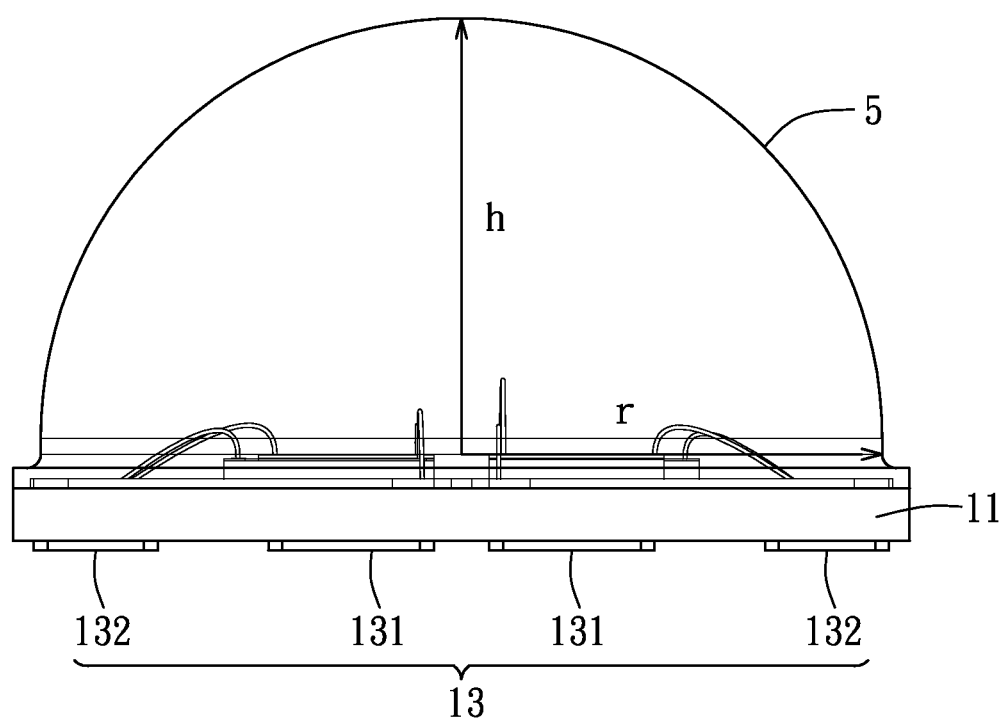
FIG. 5 is a schematic side view illustrating the largest height and the largest radius of a lens of the first preferred embodiment.
Figure 7:
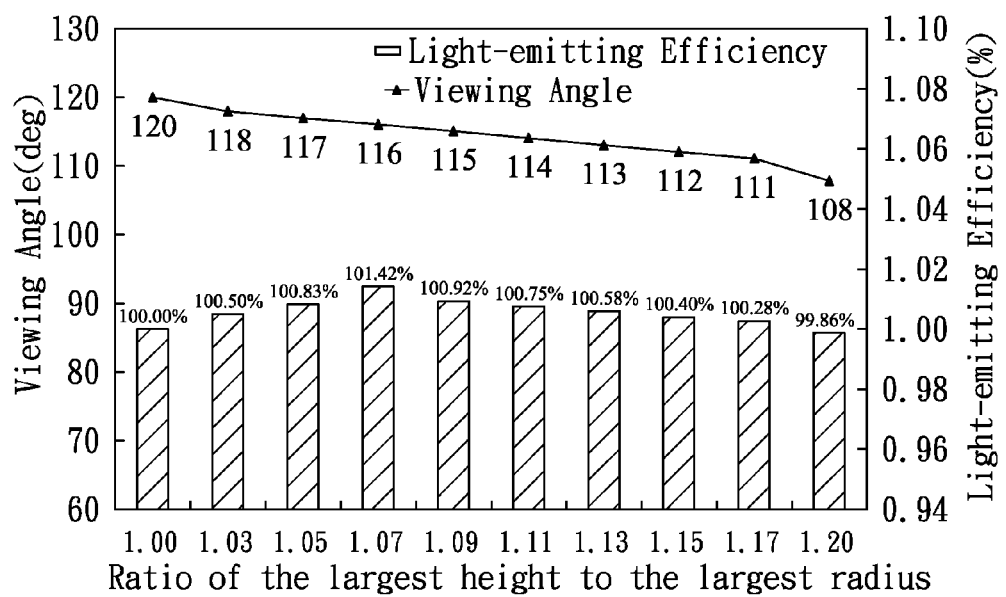
FIG. 7 is a chart for explaining the relationship among the ratio of the largest height to the largest radius of the lens, the light-emitting efficiency and a viewing angle of the first preferred embodiment.
Figure 8:
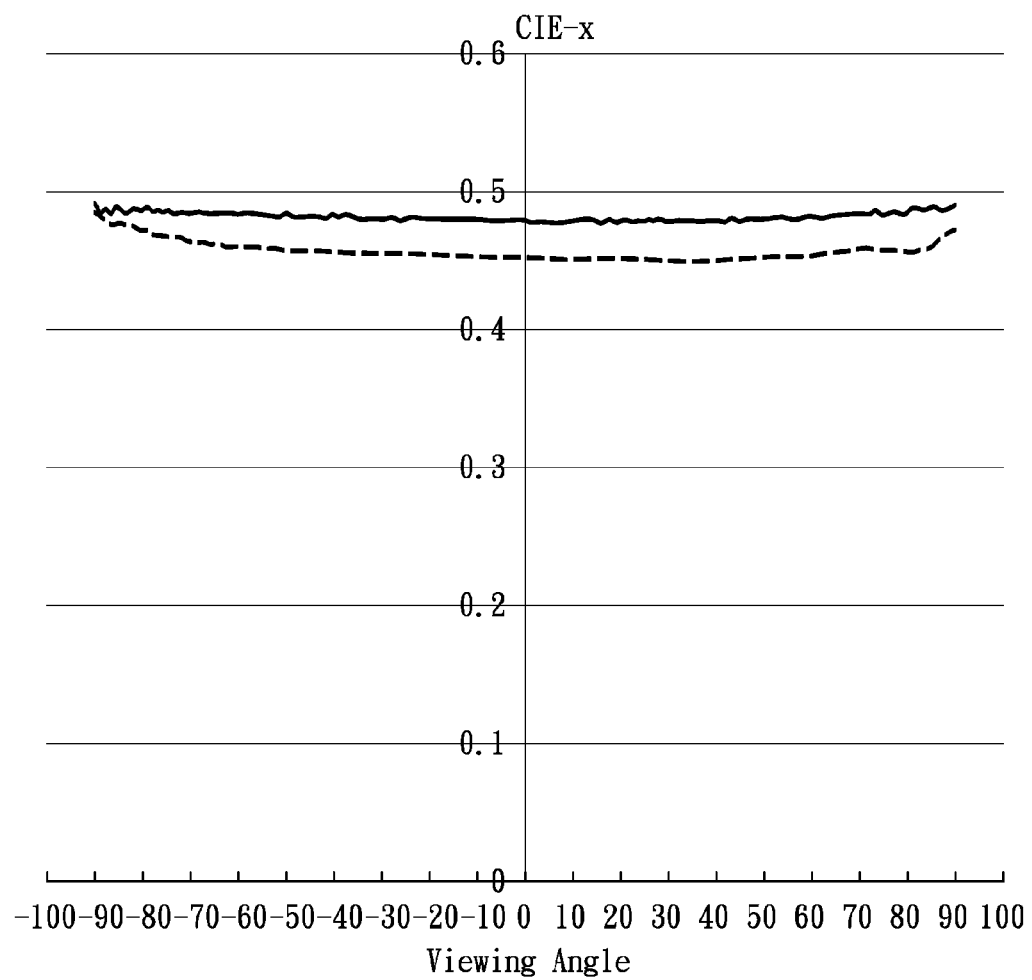
FIG. 8 is a plot for illustrating the uniformity of a mixed light of the first preferred embodiment that is doped with a diffuser (solid line) and uniformity of a mixed light of the lens that is not doped with a diffuser (dotted line) at different viewing angles.
Figure 9:
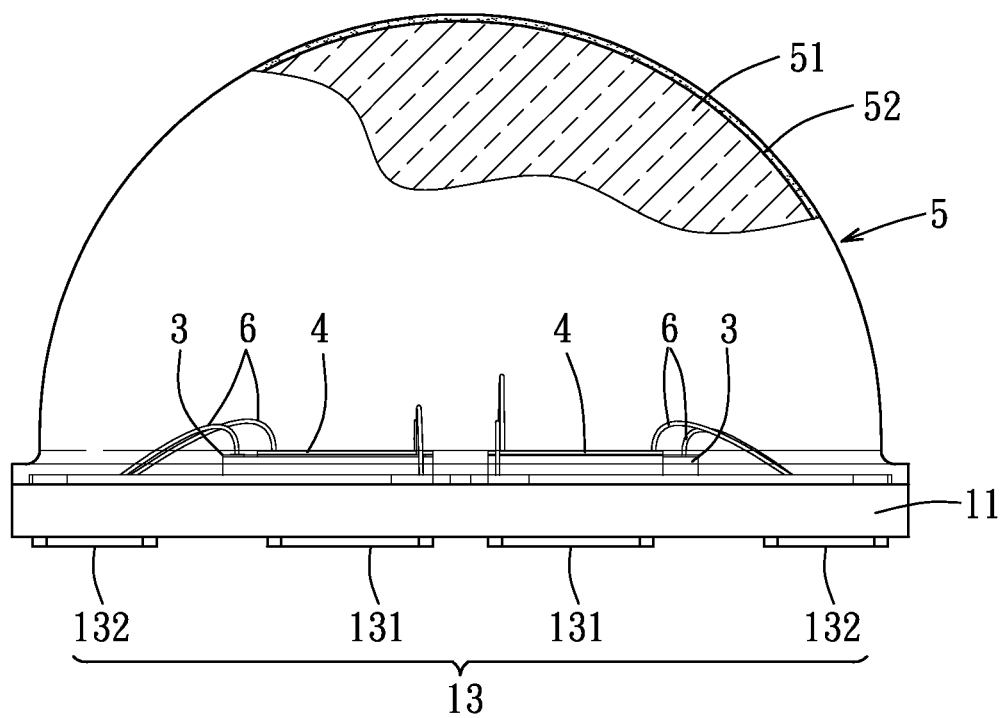
FIG. 9 is a partly cross sectional view of a modification of the first preferred embodiment.

Referring to FIGS. 1, 2 and 5, the lens 5 is disposed on the substrate 11 to cover the first and second light-emitting chips 2, 3 and the fluorescent layer 4. The lens 5 covers the chip-mounting region 121 and the conductive pad regions 122. The lens 5 has a largest diameter in an imaginary plane defined by top faces of the first light-emitting chips 2, and the largest diameter is equal to a diagonal length of the square region of the chip-mounting region 121. That is, the chip-mounting region 121 is a maximum square region in an area covered by the lens 5. In this embodiment, the lens 5 is made by directly curing on the substrate 11 a colloid resin (silicone or epoxy) that is doped with a diffuser (boron nitride) in a concentration of not greater than 0.5 wt %. The colloid resin may flow into the recesses 123 proximate to the periphery of the chip-mounting region 121, thereby increasing the adhesion between the lens 5 and the substrate 11. The lens 5 has a largest height (h) from the imaginary plane to a vertex of the lens 5, and a largest radius (r) in the imaginary plane. Preferably, a ratio of the largest height (h) to the largest radius (r) is greater than 1 and smaller than 1.2 (i.e., 1<h/r<1.2), thereby obtaining an enhanced light-emitting efficiency (see FIG. 7). Further, referring to FIG. 8, the uniformity of mixed light resulted by the lens 5 that is doped with the diffuser (solid line) is higher than that of the lens 5 that is not doped with the diffuser (dotted line). In an alternative embodiment, referring to FIG. 9, the lens 5 includes a main body 51 made of a light transmitting material, and a diffusion layer 52 covering over the main body 51. The colloid resin is first cured to form the main body 51, and a diffuser is then mixed with the colloid resin to form a mixture, followed by applying the mixture on a surface of the main body 51 to form the diffusion layer 52, thus obtaining the lens 5.

Figure 10:
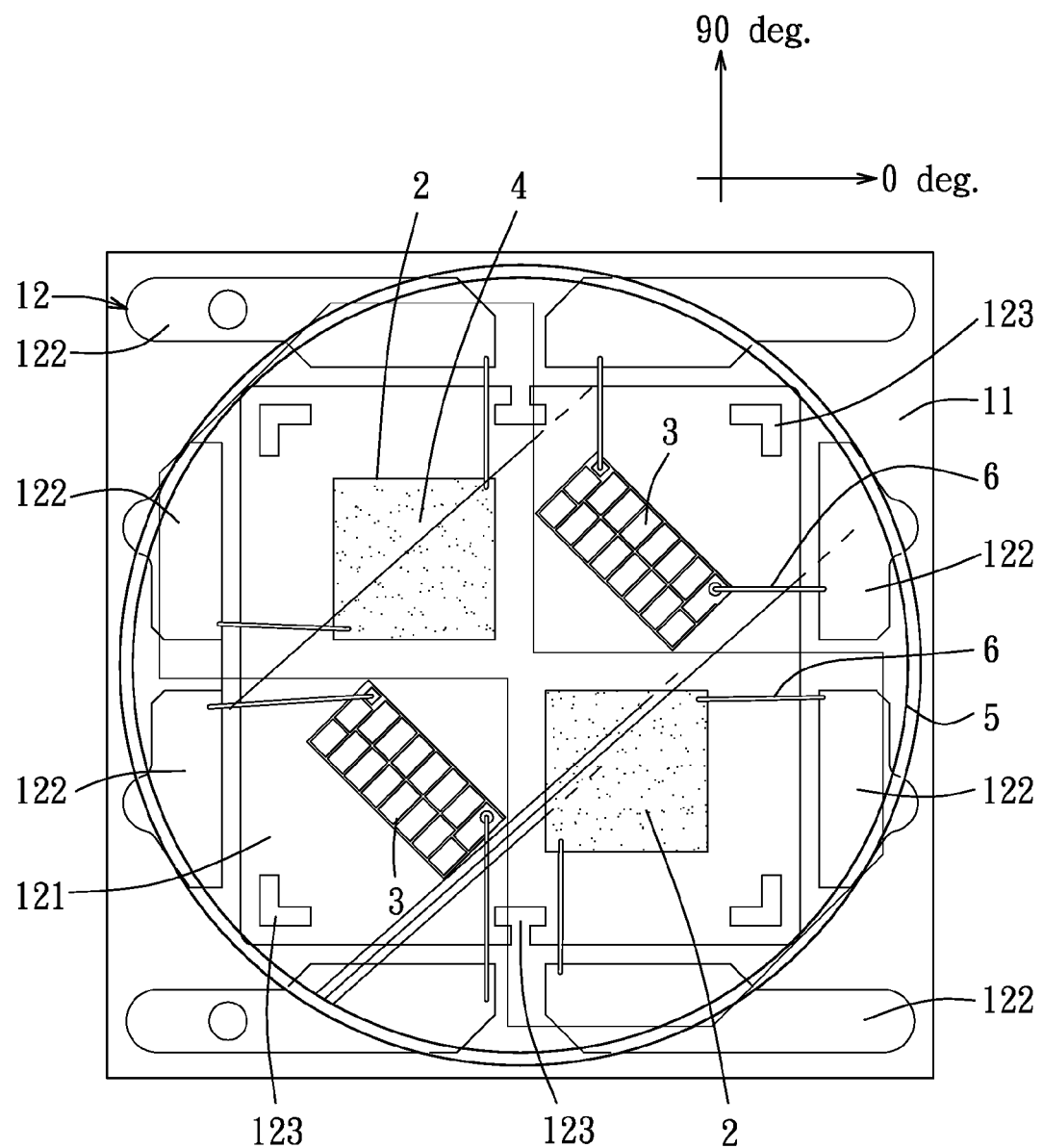
FIG. 10 is a top view of the second preferred embodiment of a light-emitting diode device according to the present invention.

Referring to FIGS. 10 and 11, the second preferred embodiment of a light-emitting diode device of the present invention is similar to the first preferred embodiment, except that, in the second preferred embodiment, the fluorescent layer 4 is only coated on the first light-emitting chips 2, and the heat-dissipation region 131 is in the form of a single piece. In addition, each of the second light-emitting chips 3 has a side face facing the side face of the other one of the second light-emitting chips 3, and the side face of each of the second light-emitting chips 3 inclines at an angle ($\alpha$) of 40° to 50° with respect to an adjacent side face of one of the first light-emitting chips 2. In this embodiment, the angle ($\alpha$) is about 45°. Since the second light-emitting chips 3 are in the form of a rectangle in this embodiment, the chip absorption between the first and second light-emitting chips 2, 3 can be reduced by the rotation of the second light-emitting chips 3. Therefore, the light-emitting amount can be increased. Specifically, the brightness of the present embodiment is increased by 3% compared to that of the first preferred embodiment. In addition, the viewing angles at 0-degree axis and 90-degree axis are approximately identical (see FIG. 10). As shown in the following Table 1, the difference between the viewing angles (VA) of the 0-degree axis and the 90-degree axis is about 6 degrees in the first preferred embodiment. In the second preferred embodiment, after the second light-emitting chips 3 are rotated 45 degrees with respect to the first light-emitting chips 2, the difference of the viewing angles (VA) is reduced to 1 degree. Therefore, it is preferable that the angle ($\alpha$) between the side face of each of the second light-emitting chips 3 and an adjacent side face of one of the first light-emitting chips 2 is set at 40° to 50°.

It should be noted that rotation of the chips can be performed on the first light-emitting chips 2. That is, compared to the first embodiment, each of the first light-emitting chips 2 has a side face facing the side face of the other one of the first light-emitting chips 2, and the side face of each of the first light-emitting chips 2 inclines at an angle with respect to an adjacent side face of one of the second light-emitting chips 3.

TABLE 1

| Embodiment | Axis | Viewing Angle (VA) | Viewing Angle Difference (ΔVA) |
|---|---|---|---|
| 1 | 0° | 137.6° | 6° |
|  | 90° | 131.6° |  |
| 2 | 0° | 135.9° | 1° |
|  | 90° | 136.9° |  |

To sum up, the light-emitting diode device of the present invention has a chip-mounting region 121 having a large area for mounting the first light-emitting chips 2 and the second light-emitting chips 3, so that the lateral light from the first light-emitting chips 2 and the second light-emitting chips 3 may not be blocked. In addition, the light-emitting efficiency can be enhanced by virtue of the light reflection of the chip-mounting region 121 and the selective coating of the fluorescent layer 4 on the light-emitting chips. Further, the heat-dissipation rate can be increased by virtue of the chip-mounting region 121 and the heat-dissipation regions 131. Besides, the uniformity of the mixed light can be enhanced by virtue of the diffuser. Furthermore, by inclining the side face of each of the second light-emitting chips 3 at the angle $\alpha$ of about 45 degrees with respect to an adjacent side face of one of the first light-emitting chips 2, the light-emitting amount can be increased, and the viewing angles at the 0-degree axis and the 90-degree axis can be approximately identical.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

What is claimed is:

1. A light-emitting diode device comprising:
a substrate;
an upper metal film disposed on an upper surface of said substrate, and including a chip-mounting region and a plurality of conductive pad regions surrounding said chip-mounting region;
two first light-emitting chips and two second light-emitting chips disposed on said chip-mounting region, said first and second light-emitting chips being disposed alternately, two of said first and second light-emitting chips being opposite to each other, said second light-emitting chips emitting light having a wavelength different from that emitted by said first light-emitting chips;
a fluorescent layer coated on said first light-emitting chips; and
a lens disposed on said substrate to cover said first and second light-emitting chips and said fluorescent layer;
wherein said lens has a largest height from an imaginary plane defined by a top face of each of said first light-emitting chips, and a largest radius in said imaginary plane, a ratio of said largest height to said largest radius being greater than 1 and smaller than 1.2.

2. The light-emitting diode device of claim 1, wherein said fluorescent layer is coated on said first light-emitting chips and on parts of said chip-mounting region proximate to said first light-emitting chips, and is not coated on said second light-emitting chips.

3. The light-emitting diode device of claim 1, wherein each of said second light-emitting chips has a side face facing said side face of the other one of said second light-emitting chips.

4. The light-emitting diode device of claim 1, wherein each of said first light-emitting chips has a side face facing said side face of the other one of said first light-emitting chips.

5. The light-emitting diode device of claim 1, wherein said first and second light-emitting chips are spaced apart from one another by a distance ranging from 0.2 mm to 0.5 mm.

6. The light-emitting diode device of claim 1, wherein said upper metal film is formed with a plurality of recesses in said chip-mounting region proximate to a periphery of said chip-mounting region.

7. The light-emitting diode device of claim 6, wherein the shape of each of said recesses is selected from a group consisting of L or T.

8. The light-emitting diode device of claim 1, wherein said lens is made from a colloid resin doped with a diffuser in a concentration of not greater than 0.5 wt %.

9. The light-emitting diode device of claim 1, wherein said lens includes a main body made of a light transmitting material, and a diffusion layer covering over said main body.

10. A light-emitting diode device comprising:
a substrate;
an upper metal film disposed on an upper surface of said substrate, and including a chip-mounting region and a plurality of conductive pad regions surrounding said chip-mounting region;
two first light-emitting chips and two second light-emitting chips disposed on said chip-mounting region, said first and second light-emitting chips being disposed alternately, two of said first and second light-emitting chips being opposite to each other, said second light-emitting chips emitting light having a wavelength different from that emitted by said first light-emitting chips;
a fluorescent layer coated on said first light-emitting chips; and
a lens disposed on said substrate to cover said first and second light-emitting chips and said fluorescent layer;
wherein said chip-mounting region is a square region, and said lens covers said chip-mounting region and has a largest diameter in an imaginary plane defined by a top face of each of said first light-emitting chips, said largest diameter being equal to a diagonal length of said square region.

11. The light-emitting diode device of claim 10, wherein said fluorescent layer is coated on said first light-emitting chips and on parts of said chip-mounting region proximate to said first light-emitting chips, and is not coated on said second light-emitting chips.

12. The light-emitting diode device of claim 10, wherein each of said second light-emitting chips has a side face facing said side face of the other one of said second light-emitting chips.

13. The light-emitting diode device of claim 10, wherein each of said first light-emitting chips has a side face facing said side face of the other one of said first light-emitting chips.

14. The light-emitting diode device of claim 10, wherein said first and second light-emitting chips are spaced apart from one another by a distance ranging from 0.2 mm to 0.5 mm.

15. The light-emitting diode device of claim 10, wherein said upper metal film is formed with a plurality of recesses in said chip-mounting region proximate to a periphery of said chip-mounting region.

16. The light-emitting diode device of claim 15, wherein the shape of each of said recesses is selected from a group consisting of L or T.

17. The light-emitting diode device of claim 10, wherein said lens is made from a colloid resin doped with a diffuser in a concentration of not greater than 0.5 wt %.

18. The light-emitting diode device of claim 10, wherein said lens includes a main body made of a light transmitting material, and a diffusion layer covering over said main body.

19. A light-emitting diode device comprising:
a substrate;
an upper metal film disposed on an upper surface of said substrate, and including a chip-mounting region and a plurality of conductive pad regions surrounding said chip-mounting region;
two first light-emitting chips and two second light-emitting chips disposed on said chip-mounting region, said first and second light-emitting chips being disposed alternately, two of said first and second light-emitting chips being opposite to each other, said second light-emitting chips emitting light having a wavelength different from that emitted by said first light-emitting chips;
a fluorescent layer coated on said first light-emitting chips; and
a lens disposed on said substrate to cover said first and second light-emitting chips and said fluorescent layer; and
a lower metal film and a plurality of metal interconductors, said lower metal film being disposed on a lower surface of said substrate, said plurality of metal interconductors being disposed between said upper metal film and said lower metal film;
wherein said lower metal film further comprises at least one heat-dissipation region and a plurality of solder pad regions that respectively correspond in position to said conductive pad regions, each of said metal interconductors passing through said substrate to interconnect one of said conductive pad regions and a respective one of said solder pad regions.

20. The light-emitting diode device of claim 19, wherein said upper metal film includes eight of said conductive pad regions, said lower metal film including eight of said solder pad regions that respectively correspond in position to eight of said conductive pad regions, wherein each of said first and second chips is electrically connected to respective two of said conductive pad regions, said heat-dissipation region having two opposite sides each of which is adjacent to respective four of said solder pad regions.

21. The light-emitting diode device of claim 19, wherein said upper metal film includes eight of said conductive pad regions, said lower metal film including eight of said solder pad regions that respectively correspond in position to eight of said conductive pad regions, wherein each of said first and second chips is electrically connected to respective two of said conductive pad regions, said lower metal film including four of said heat-dissipation regions, each of said heat-dissipation regions is adjacent to respective two of said solder pad regions.

22. The light-emitting diode device of claim 19, wherein said fluorescent layer is coated on said first light-emitting chips and on parts of said chip-mounting region proximate to said first light-emitting chips, and is not coated on said second light-emitting chips.

23. The light-emitting diode device of claim 19, wherein each of said second light-emitting chips has a side face facing said side face of the other one of said second light-emitting chips.

24. The light-emitting diode device of claim 19, wherein each of said first light-emitting chips has a side face facing said side face of the other one of said first light-emitting chips.

25. The light-emitting diode device of claim 19, wherein said first and second light-emitting chips are spaced apart from one another by a distance ranging from 0.2 mm to 0.5 mm.

26. The light-emitting diode device of claim 19, wherein said upper metal film is formed with a plurality of recesses in said chip-mounting region proximate to a periphery of said chip-mounting region.

27. The light-emitting diode device of claim 26, wherein the shape of each of said recesses is selected from a group consisting of L or T.

28. The light-emitting diode device of claim 19, wherein said lens is made from a colloid resin doped with a diffuser in a concentration of not greater than 0.5 wt %.

29. The light-emitting diode device of claim 19, wherein said lens includes a main body made of a light transmitting material, and a diffusion layer covering over said main body.

* * * * *